United States Patent
Koch, II et al.

(10) Patent No.: US 6,753,708 B2
(45) Date of Patent: *Jun. 22, 2004

(54) DRIVER CIRCUIT CONNECTED TO PULSE SHAPING CIRCUITRY AND METHOD OF OPERATING SAME

(75) Inventors: Kenneth Koch, II, Ft. Collins, CO (US); Mozammel Hossain, Ft. Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/167,493

(22) Filed: Jun. 13, 2002

(65) Prior Publication Data

US 2003/0231034 A1 Dec. 18, 2003

(51) Int. Cl.[7] .................................................. H03B 1/00
(52) U.S. Cl. ...................................... 327/112; 327/108
(58) Field of Search ......................... 327/108–112, 170, 327/263, 268, 376, 377, 389, 391, 427, 285, 288; 326/20, 23, 24, 26, 27, 83, 87

(56) References Cited

U.S. PATENT DOCUMENTS

| | | | |
|---|---|---|---|
| 4,430,587 A | 2/1984 | Tennyson | 327/281 |
| 4,617,529 A | 10/1986 | Suzuki | 331/57 |
| 4,622,482 A | 11/1986 | Ganger | 327/427 |
| 4,739,189 A | 4/1988 | Kellogg | 327/379 |
| 5,041,741 A * | 8/1991 | Steele | 326/83 |
| 5,068,553 A * | 11/1991 | Love | 327/288 |
| 5,280,420 A * | 1/1994 | Rapp | 363/60 |
| 5,324,999 A | 6/1994 | Hunley et al. | 327/555 |
| 5,479,132 A | 12/1995 | Verhaeghe et al. | 327/553 |
| 5,633,600 A * | 5/1997 | Ohnishi | 326/17 |
| 5,694,065 A * | 12/1997 | Hamasaki et al. | 327/108 |
| 5,929,681 A | 7/1999 | Suzuki | 327/284 |
| 6,121,813 A | 9/2000 | Furuchi | 327/285 |

* cited by examiner

Primary Examiner—Terry D. Cunningham
Assistant Examiner—Long Nguyen

(57) ABSTRACT

An integrated circuit driver includes an output stage having source drain paths of a PFET and NFET connected in series with each other across DC power supply terminals. A pair of inverters simultaneously responsive to a bilevel signal drive gate electrodes of the PFET and NFET. Each inverter includes a pair of switches and a resistor for connecting opposite polarity voltage sources to a separate capacitor connected in shunt with gate electrodes of the PFET and NFET. The inverters, resistors and capacitors prevent the PFET and NFET from being on simultaneously.

13 Claims, 2 Drawing Sheets

DRIVER CIRCUIT CONNECTED TO PULSE SHAPING CIRCUITRY AND METHOD OF OPERATING SAME

FIELD OF INVENTION

The present invention relates generally to driver circuits and, more particularly, to a driver circuit including first and second opposite conductivity type transistors which are prevented from conducting simultaneously during a transition between first and second voltage levels by pulse shaping circuitry, and to a method of operating same.

BACKGROUND ART

One type of driver circuit that is frequently employed, particularly on integrated circuit chips, includes first and second opposite conductivity type transistors, each including a control electrode and a path which is switched on and off between a pair of further electrodes. Each path is switched on and off in response to a voltage applied to the control electrode of the particular transistor being on opposite sides of a threshold. The paths of the first and second transistors are connected in series across terminals of a DC power supply. An output terminal between the series connected paths drives a load.

In a typical integrated circuit chip, the transistors are opposite conductivity type metal oxide semiconductor field effect transistors (MOSFETs), wherein the control electrodes are gate electrodes and the further electrodes are source and drain electrodes. Such a driver includes a positive channel field effect transistor (PFET) and a negative channel field effect transistor (NFET). The switched path between the source and drain electrodes of each field effect transistor (FET) is frequently referred to as a source drain path and the source drain paths of the PFET and NFET are connected in series across opposite polarity terminals of the power supply.

The typical integrated circuit chip includes many such drivers that are responsive to bilevel sources having positive and negative going transitions between first and second voltage levels that are usually approximately equal to the voltages at the power supply terminals. The bilevel sources can be either data or clock sources. In response to the bilevel source being at the first (low) voltage level, the PFET and NFET are respectively on and off, while the NFET and PFET are respectively on and off in response to the bilevel source being at the second (high) voltage level. A relatively high impedance is provided by the source drain path of the NFET or PFET which is off so that substantial current does not flow through both the PFET and NFET of the driver while the bilevel source is at the first and second voltage levels. To minimize power consumption, the PFET and NFET should not be on at the same time during the transitions.

Many of the drivers of the foregoing type on a typical integrated circuit chip are simultaneously responsive to the transitions. If many of the drivers of the foregoing type are simultaneously responsive to the transitions and if the PFET and NFET of each of these drivers were on at the same time during the transitions, a substantial amount of current, frequently referred to as crow bar current, would be drawn from the power supply. The current could be so great as to cause overheating of the integrated circuit chip and result in a substantial decrease in the voltage between the power supply terminals. Similar problems can also exist with bipolar drivers including PNP and NPN transistors having series connected emitter collector paths.

In the past, one approach to resolving the problem has involved complicated circuitry which takes into account processing variables in making the integrated circuits, as well as changes that occur to the circuit elements as a result of power supply voltage and temperature variations of the integrated circuit chip carrying the circuitry. Another complicated approach has involved staging a number of field effect transistors. These complicated circuits occupy a significant amount of space on the integrated circuit chip and consume additional power, resulting in possible unnecessary heating of the chip.

There is a prior art circuit wherein conventional capacitors are connected in negative feedback paths to the gates of opposite conductivity type field effect transistors having series connected source drain paths. One electrode of each capacitor is connected to an output terminal between the source drain paths, while the other electrode of each capacitor is connected to the gate electrode of one of the field effect transistors. A problem with this approach is that the voltage across each of the capacitors varies as a function of load variations. Hence, switching of the field effect transistors is a function of the load variations which can result in poor control. In this prior art circuit, both field effect transistors appear to be turned on simultaneously during a transition, resulting in substantial current flow. Another problem with this prior art circuit is that the capacitors are charged and discharged through source drain paths of additional field effect transistors, rather than through resistors.

SUMMARY OF THE INVENTION

In accordance with one aspect of the invention, a circuit comprises an input terminal for connection to a voltage source having first and second levels and a transition between the levels, and a driver includes first and second opposite conductivity type transistors, each including a control electrode and a path switched on and off in response to the control electrode voltage being on opposite sides of a threshold. The first and second transistor paths are connected in series across opposite power supply terminals. Pulse shaping circuitry causes the first and second transistor paths to be respectively (1) on and off while the voltage source has the first level, and (2) off and on while the voltage source has the second level. The pulse shaping circuitry also prevents both paths from being on simultaneously. The circuitry includes a first resistive impedance and first shunt capacitor, wherein the first resistive impedance is connected for supplying current to the first capacitor and the first transistor control electrodes. The first capacitor is connected across the first transistor control electrode and a first of the power supply terminals.

Another aspect of the invention relates to a circuit comprising an input terminal for connection to a voltage source having first and second levels and a transition between the levels. A driver includes first and second opposite conductivity type transistors, each including a control electrode and a path switched on and off in response to a voltage applied to the control electrode being on opposite sides of a threshold. The first and second transistor paths are connected in series across opposite power supply terminals. Pulse shaping circuitry causes the paths of the first and second transistors to be respectively (1) on and off while the voltage source has the first level and (2) off and on while the voltage source has the second level. The pulse shaping circuitry also prevents the first and second transistors from being on simultaneously. The circuitry includes first and second switching circuits adapted to be connected to be simultaneously responsive to the voltage at the input terminal. The first and second switching circuits respectively include output terminals having DC connections to the control electrodes of the first and second transistors. The pulse shaping circuitry also has first and second capacitors respectively having DC connections between (1) the first control electrode and the first power supply terminal and (2) the second control electrode and the second power supply terminal.

The first switching circuit includes a first resistive impedance for supplying current from the first power supply terminal to the control electrode of the first transistor and the first capacitor while the voltage at the input terminal has the first level. The first switching circuit is arranged for supplying a voltage substantially equal to the voltage at the second power supply terminal to (1) the control electrode of the first transistor and (2) the first capacitor while the voltage at the input terminal has the second level.

The second switching circuit includes a second resistive impedance for supplying current from the second power supply terminal to the control electrode of the second transistor and the second capacitor while the voltage at the input terminal has the second level. The second switching circuit is arranged for supplying a voltage substantially equal to the voltage at the first power supply terminal to (1) the control electrode of the second transistor and (2) the second capacitor while the voltage at the input terminal has the first level.

In a preferred embodiment, the first switching circuit comprises a first inverter including third and fourth transistors respectively switched on and off in response to the voltage at the input terminal respectively having first and second values. The first inverter includes the first resistive impedance for supplying current from the first power supply terminal to the control electrode of the first transistor and the first capacitor while the third transistor is switched on. The second switching circuit comprises a second inverter including fifth and sixth transistors respectively switched on and off in response to the voltage at the input terminal respectively having first and second values. The second inverter includes the second resistive impedance for supplying current from the second power supply terminal to the control electrode of the second transistor and the second capacitor while the sixth transistor is switched on.

In the preferred embodiment, the fourth and fifth transistors while switched on are connected to supply voltages substantially at the second and first power supply terminals to the control electrodes of the first and second transistors and the first and second capacitors, respectively.

Another aspect of the invention relates to a method of operating a driver including first and second opposite conductivity type transistors, each including a control electrode and a path controlled in response to a voltage applied to the control electrode. The paths of the first and second transistors are connected in series across opposite power supply terminals. First and second capacitors are respectively connected in shunt with the control electrodes. During a first interval: the paths of the first and second transistors are respectively turned on and off, while the second capacitor is charged and the first capacitor is discharged by applying (1) a first voltage having a first value to the control electrode of the first transistor, (2) the first voltage value across the second capacitor, and (3) a second voltage having the first value to the control electrode of the second transistor. During a second interval: the paths of the first and second transistors are respectively turned off and on, while the second capacitor is discharged and the first capacitor is charged by applying (1) the second value of the first voltage to the control electrode of the first transistor, (2) the first voltage value across the first capacitor, and (3) the second value of the second voltage to the control electrode of the second transistor. During an initial portion of a first transitional period between the first and second intervals: the path of the first transistor is turned off while the path of the second transistor is maintained off by changing the first voltage from the first value toward the second value while the first capacitor remains substantially discharged and the second capacitor remains substantially charged. During a second portion of the first transitional period, the path of the second transistor is turned on while the path of the first transistor is maintained off by changing the charge on the second capacitor so that there is a change in the value of the second voltage from the first value toward the second value. During an initial portion of a second transitional period between the second and first intervals: the path of the second transistor is turned off while the path of the first transistor is maintained off by changing the second voltage from the second value toward the first value while the second capacitor remains substantially discharged and the first capacitor remains substantially charged. During a second portion of the second transitional period the path of the first transistor is turned on while the path of the second transistor is maintained off by changing the charge on the first capacitor so that there is a change in the value of the first voltage from the second value toward the first value.

The above and still further objects, features and advantages of the present invention will become apparent upon consideration of the following detailed description of a specific embodiment thereof, especially when taken in conjunction with the accompanying drawings.

DETAILED DESCRIPTION OF THE DRAWING

Figure 1:
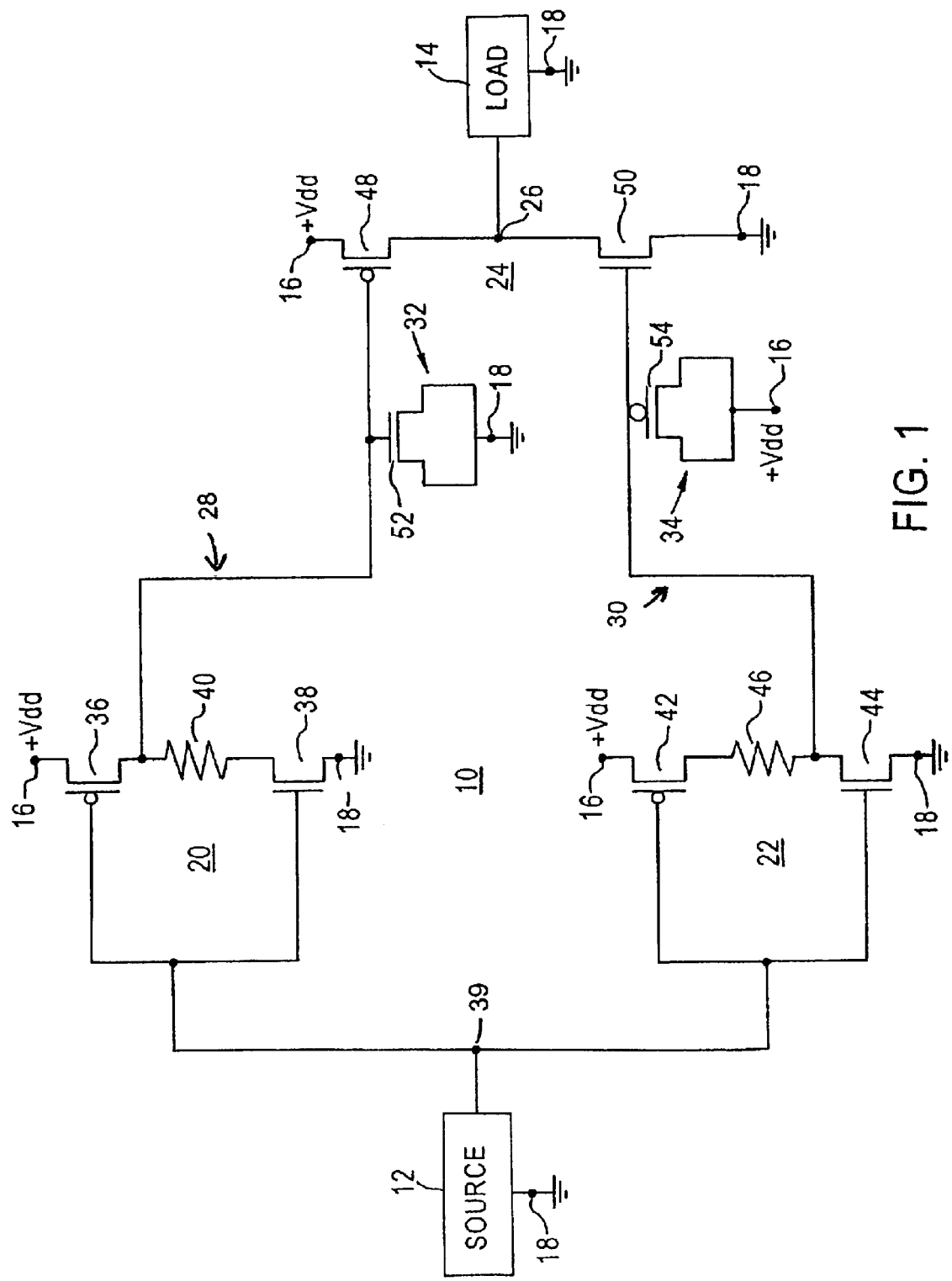
FIG. 1 is a circuit diagram of a preferred embodiment of the present invention.

Reference is now made to FIG. 1 of the drawing wherein driver circuit 10 is illustrated as being connected between bilevel voltage source 12 and load 14. Driver circuit 10, source 12 and load 14 are complementary metal oxide semiconductor (CMOS) circuits on an integrated circuit chip having a positive DC power supply terminal 16, at a potential of +1.0Vdd, and a negative DC power supply terminal 18, at ground potential, i.e., 0Vdd. The bilevel output of voltage source 12, which can be either a data or clock source, typically switches between potentials of 1.0Vdd and 0Vdd, and has positive and negative going short duration transitions between these potentials. Load 14, typically other circuitry on the integrated circuit and/or off chip circuitry, is subject to substantial variations, depending upon the number of circuits in load 14 which are activated at a particular time.

Driver circuit 10 includes inverters 20 and 22, connected to be driven in parallel by the output of source 12. Driver circuit 10 also comprises output stage 24, including output terminal 26 which is connected in a DC circuit to drive load 14. Output stage 24 is connected to be responsive to output voltages of inverters 20 and 22 via DC circuits 28 and 30 which respectively include switched voltage controlled shunt capacitors 32 and 34.

Inverter 20 includes complementary transistors in the form of PFET 36 and NFET 38 having gate electrodes connected to be driven in parallel by the bilevel output of source 12 at terminal 39 and source drain paths which are switched on and off in a complementary manner by the voltage applied to the gate electrodes of the PFET and NFET. The source drain paths of PFET 36 and NFET 38 are connected in series with each other and across DC power supply terminals 16 and 18. A resistive impedance, i.e., resistor 40, is connected in series with the source drain paths of PFET 36 and NFET 38, between the drains of the PFET and NFET of inverter 20. The use of resistor 40 as a resistive impedance, is advantageous because it (1) enables a lower resistance to be achieved and (2) provides better resistance value stability with regard to variations of integrated circuit temperature and power supply voltage, and integrated circuit manufacturing. A first end of DC circuit 28 is connected to a common terminal at one side of resistor 40 and the drain electrode of PFET 36.

Inverter 22 is similar to inverter 20, in that inverter 22 includes PFET 42 and NFET 44 and a resistive impedance in the form of resistor 46. The gate electrodes of PFET 42 and NFET 44 are connected to be driven in parallel by the output voltage of source 12 at terminal 39 and the source drain paths of PFET 42 and NFET 44 are connected in series with each other and a resistive impedance, i.e., resistor 46. However, inverter 22 differs from inverter 20 because the common terminal of resistor 46 and the drain of NFET 44 are connected to a first end of DC circuit 30. Inverters 20 and 22 thus can be considered as switching circuits for selectively supplying, to the output terminals thereof, voltages substantially equal to the power supply voltages 1.0Vdd and 0Vdd.

Output stage 24 includes PFET 48 and NFET 50 having source drain paths connected in series with each other across DC power supply terminals 16 and 18. The drain electrodes of PFET 48 and NFET 50 have a common connection to output terminal 26 which is connected to load 14. PFET 48 and NFET 50 have gate electrodes respectively connected to the second ends of DC circuits 28 and 30. The gate electrodes of PFET 48 and NFET 50 are respectively connected to first electrodes of shunt capacitors 32 and 34. The second electrode of capacitor 32 is connected to ground DC power supply terminal 18, while the second electrode of capacitor 34 is connected to +Vdd power supply terminal 16. Because of the connections of the electrodes of capacitors 32 and 34 to the gate electrodes of PFET 48 and NFET 50 and to the constant voltages at the power supply terminals 16 and 18, the waveforms across the capacitors are independent of the current that load 14 draws from output stage 24. PFET 48 and NFET 50 have thresholds such that (1) in response to the voltage applied to the gate electrode of PFET 48 being less than and greater than the threshold voltage of the PFET, the PFET source drain path is turned on and off, respectively, and (2) in response to the voltage applied to the gate electrode of NFET 48 being less than and greater than the threshold voltage of the NFET, the NFET source drain path is turned off and on, respectively.

In the preferred embodiment, capacitors 32 and 34 respectively comprise NFET 52 and PFET 54. One electrode of each of capacitors 32 and 34 respectively comprises the gate electrodes of NFET 52 and PFET 54. The other electrode of each of capacitors 32 and 34 respectively comprises the source drain paths of NFET 52 and PFET 54. The source and drain electrodes of NFET 52 are connected together and to ground terminal 18, while the source and drain paths of PFET 54 are connected together and to +Vdd power supply terminal 16. Each of NFET 52 and PFET 54 includes an insulator between the gate electrode and the source drain path thereof.

The circuitry of FIG. 1, including the thresholds of PFET 48 and NFET 50, is such that the source drain paths of PFET 48 and NFET 50 are never simultaneously on. Consequently, crowbar current cannot flow between power supply terminals 16 and 18 through the source drain paths of PFET 48 and NFET 50.

Figure 2:
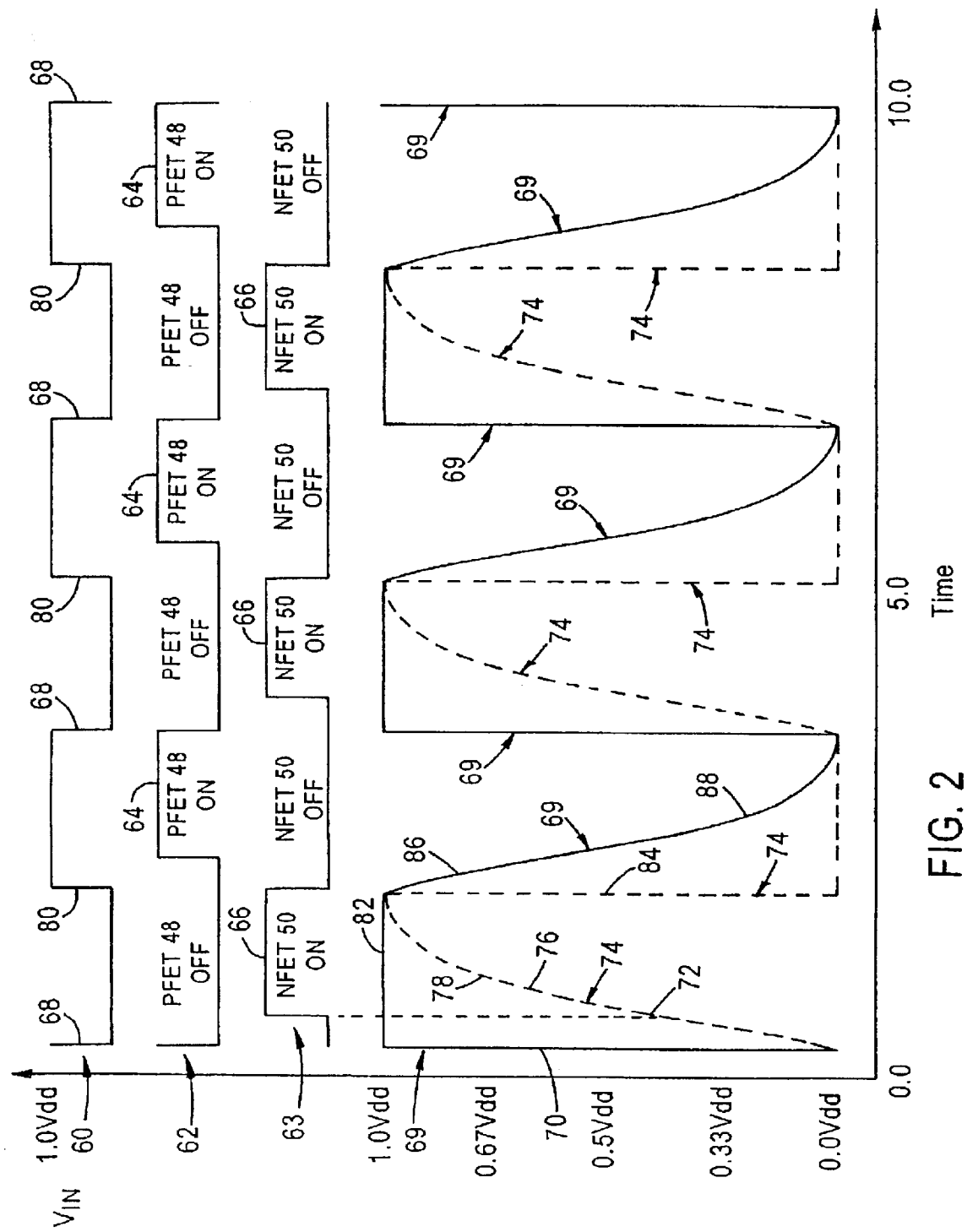
FIG. 2 includes a series of waveforms helpful in describing the operation of the circuit of FIG. 1.

Reference is now made to FIG. 2 of the drawing which is helpful in describing the operation of the circuit of FIG. 1. The output voltage of source 12, indicated by bilevel waveform 60, is illustrated as having a 50—50 duty cycle, although it is to be understood that the output of source 12 can have any suitable duty cycle for a clock or data source.

During the half cycles of source 12 when the output voltage of the source has a value of 1.0 Vdd, NFETs 38 and 44 are turned on and PFETs 36 and 42 are turned off. Consequently, a voltage approximately equal to the ground voltage at terminal 18 is supplied to the first end of DC circuit 28 (at the drain of PFET 36) through the low impedance, turned on source drain path of NFET 38 and resistor 40. At the same time, the ground voltage at terminal 18 is supplied to the first, input end of DC circuit 30 (at the drain of NFET 44) through the low impedance, turned on source drain path of NFET 44. Just before the end. of the half cycles when the output voltage of source 12 has a value of 1.0 Vdd, inverters 20 and 22 apply low voltages, substantially equal to the voltage at ground terminal 18, to the gate electrodes of PFET 48 and NFET 50, causing the PFET and NFET to be respectively turned on and off. In addition, at this time there is virtually no voltage across the insulator of NFET 52 because the gate electrode thereof and the source drain path thereof are both substantially at ground potential, resulting in the voltage across capacitor 32 being zero. In contrast, because (1) NFET 44 is turned on, causing the input of DC path 30 to be substantially at ground, i.e., 0Vdd, and (2) the source drain path of PFET 54 is at 1.0 Vdd, there is a voltage substantially equal to 1.0 Vdd across the insulator of PFET 54 that comprises capacitor 34.

During the half cycles of source 12 when the output voltage of the source has a value of 0Vdd, NFETs 38 and 44 are turned off and PFETs 36 and 42 are turned on. Consequently, the 1.0Vdd voltage at terminal 16 is supplied to the first, input end of DC circuit 28 (at the drain of PFET 36) through the low impedance, turned on source drain path of PFET 36. At the same time, the 1.0Vdd voltage at terminal 16 is supplied to the first end of DC circuit 30 (at the drain of NFET 44) through resistor 46 and the low impedance, turned on source drain path of PFET 42. Just before the end of the half cycles when the output voltage of source 12 has a value of 0Vdd, inverters 20 and 22 apply high voltages, substantially equal to the 1.0Vdd voltage at power supply terminal 16, to the gate electrodes of PFET 48 and NFET 50, causing the PFET and NFET to be respectively turned off and on. Also, at this time there is virtually no voltage across the insulator of PFET 54 because the gate electrode thereof and the source drain path thereof are both substantially at 1.0Vdd, resulting in the voltage across capacitor 34 being zero. In contrast, because (1) PFET 36 is turned on, causing the input of DC path 28 to be substantially at 1.0Vdd, and (2) the source drain path of NFET 52 is at ground potential, there is a voltage substantially equal to 1.0Vdd across the insulator of NFET 52, which has a finite capacitance value.

As indicated by waveforms 62 and 63, PFET 48 is turned on during intervals 64, while NFET 50 is turned on during intervals 66; intervals 64 and 66 alternate with and are mutually exclusive of each other.

At the beginning of and during short duration negative going transitions 68 of the voltage of source 12, from 1.0Vdd to 0Vdd, as indicated by waveform 60, PFET 36 rapidly goes from an off to an on condition while NFET 38 rapidly goes from an on to an off condition. In response to transitions 68, the voltage at the drain of PFET 36, at the input of DC circuit 28, changes rapidly in the positive direction, so that the voltage applied to the gate of PFET 48, indicated by waveform 69, changes rapidly, as indicated by waveform portion 70, from a value substantially equal to 0Vdd to a value substantially equal to 1.0Vdd. This results in PFET 48 changing rapidly from an on condition to an off condition, as indicated by the negative going transitions at the ends of intervals 64 of waveform 62, but has no immediate effect on the zero voltage across discharged capacitor 32.

At the beginning of and during the negative going transitions 68, PFET 42 rapidly goes from an off condition to an on condition while NFET 44 rapidly goes from an on to an off condition. Because capacitor 34 is fully charged to 1.0Vdd at the beginning of the negative going transitions 68 the current flow through resistor 46 does not increase suddenly, but increases exponentially at a rate primarily determined by the resistance of resistor 46 and the finite capacitance of capacitor 34. The exponential increase in the current through resistor 46 causes the voltage across capacitor 34 and between the gate and source of NFET 50 to increase exponentially, as indicated by portion 72 of waveform 74, which represents the voltage across the gate and source of NFET 50. During portion 72, the voltage across the gate of NFET 50 is less than the threshold of the NFET, which is assumed in FIG. 2 to be 0.33Vdd. Thus, NFET 50 remains off for a predetermined interval subsequent to negative going transition 68. During this predetermined interval, both PFET 48 and NFET 50 are off to prevent crowbar current from flowing through the source drain paths thereof between power supply terminals 16 and 18. In response to the voltage across the gate of NFET 50 crossing the threshold of the NFET, the NFET is turned on, as indicated by the positive going transition at the beginning of intervals 66 of waveform 63, whereby current can flow between load 14 and NFET 50 during intervals 66.

As exponential current continues to flow through capacitor 34 and resistor 46 while the voltage of source 12 equals 0Vdd, there is a gradual decrease in the slope of the voltage applied to the gate of NFET 50, as indicated by portion 76 of waveform 74. To enable the target voltage of 1.0Vdd to be achieved, the resistance of resistor 46 and capacitance of capacitor 34 and the duration of the half cycle of source 12 between transitions 68 and 80 of waveform 60 are properly selected. Waveform 74 reaches its target value of 1.0Vdd shortly before the occurrence of positive going transition 80 of waveform 60.

During the entire half cycle of source 12 while the source is applying a voltage of 0Vdd to driver circuit 10 the voltage at the gate of PFET 48 remains substantially at 1.0Vdd, as indicated by portion 82 of waveform 69. This is because PFET 36 couples the 1.0Vdd voltage at terminal 16 to the gate of PFET 48.

In response to positive going transitions 80 of waveform 60, complementary operations occur in driver circuit 10 relative to the operations which occur in response to the negative going transitions 68. Hence, the current flowing through resistor 46 suddenly decreases, as does the voltage at the gate of NFET 50, as indicated by portion 84 of waveform 74. Thereby, NFET 50 suddenly goes from an on to an off state, as indicated by the negative transitions of waveform 63 at the end of intervals 66. In response to the positive going transition 80, the voltage at the gate of PFET 48 decreases exponentially as indicated by portion 86 of waveform 69. PFET 48 remains off until its threshold is crossed, which is assumed in FIG. 2 to be at 0.67Vdd. In response to waveform portion 86 crossing the 0.67Vdd threshold, PFET 48 is turned on, as indicated by the positive going transitions of waveform 62 at the beginning of intervals 64. The voltage across capacitor 32 continues to decrease exponentially until the voltage across capacitor 32 goes substantially to zero. The voltage across capacitor 32 and at the gate of PFET 48 reach a target value substantially equal to 0Vdd shortly before the next negative going transition 68 of waveform 60. Operation continues in this matter.

While there has been described and illustrated a specific embodiment of the invention, it will be clear that variations in the details of the embodiment specifically illustrated and described may be made without departing from the true spirit and scope of the invention as defined in the appended claims. For example, the principles of the invention are applicable to bipolar transistors and discrete capacitors, although the use of FETs for the transition and capacitors is particularly advantageous for integrated circuits.

We claim:

1. A circuit comprising a first terminal for connection to a voltage source having first and second levels and a transition between the levels, a driver including first and second opposite conductivity type transistors, said first and second transistors being respectively a PFET and an NFET, each of said transistors including a gate electrode and a source drain path switched on and off in response to a voltage applied to the gate electrode being on opposite sides of a threshold, the first and second transistor paths being connected in series across opposite power supply terminals, and pulse shaping circuitry for (a) causing the first and second source drain paths to be respectively (i) on and off while the voltage source has the first level and (ii) off and on while the voltage source has the second level, and (b) preventing both source drain paths from being on simultaneously, the circuitry including a first resistive element and a first capacitor, the first resistive element being connected for supplying current to the first capacitor and the gate electrode of the first transistor, the first capacitor being connected across the gate electrode of the first transistor and a first of the power supply terminals, the first capacitor comprising a field effect device having a conductivity type opposite to the conductivity type of the first transistor, the circuitry further including a second resistive element and a second capacitor, the second resistive element being connected for supplying current to the second capacitor and the gate electrode of the second transistor, the second capacitor being connected across the gate electrode of the second transistor and a second of the power supply terminals.

2. The circuit of claim 1 wherein the first and second capacitors respectively include an NFET and a PFET.

3. The circuit of claim 2 wherein the first and second transistors, the first and second resistive element, and the first and second capacitors are included on an integrated circuit chip, the first and second resistive elements including first and second resistors.

4. The circuit of claim 2 wherein the pulse shaping circuitry includes first and second switching circuits each having (a) an input terminal for enabling the first and second switching circuits to be simultaneously responsive to the voltage at the first terminal and (b) an output terminal, the output terminal of the first switching circuit being connected so current can flow via a first DC path between (a) the first power supply terminal and (b) the first capacitor and the gate electrode of the first transistor, the output terminal of the second switching circuit being connected so current can flow via a second DC path between (a) the second power supply terminal and (b) the second capacitor and the gate electrode of the second transistor, the first and second DC paths respectively including the first and second resistive elements.

5. The circuit of claim 4 wherein the first and second switching circuits respectively include first and second inverters having field effect transistors.

6. The circuit of claim 5 wherein all of the field effect transistors are included on an integrated circuit chip including first and second resistors respectively comprising the first and second resistive elements connected with the first and second field effect transistors and the first and second inverters.

7. The circuit of claim 6 wherein the first and second resistors are respectively included in the first and second inverters.

8. The circuit of claim 7 wherein each of the inverters includes a PFET and an NFET, the PFET and NFET of each inverter having a source drain path and a gate electrode having a connection to the first terminal so that the gate electrodes of the PFETs and NFETs of the inverters are driven in parallel by the voltage at the first terminal, the output terminal of each of the inverters being between the source drain paths of the PFET and NFET thereof.

9. The circuit of claim 8 wherein the first resistor is connected between the source drain path of the NFET of the first inverter and the output terminal of the first inverter, the second resistor being connected between the source drain path of the PFET of the second inverter and the output terminal of the second inverter.

10. A circuit comprising a first terminal for connection to a voltage source having first and second levels and a transition between the levels, a driver including first and second opposite conductivity type transistors, each of the transistors including a control electrode and a path switched on and off in response to a voltage applied to the control electrode being on opposite sides of a threshold, the first and second transistor paths being connected in series across opposite power supply terminals, an output terminal between the paths, pulse shaping circuitry connected between the input terminal and the control electrodes for (a) causing the paths of the first and second transistors to be respectively (i) on and off while the voltage source has the first level and (ii) off and on while the voltage source has the second level, and (b) preventing the paths of the first and second transistors from being on simultaneously, the circuitry including: (a) first and second switching circuits arranged to be connected to be simultaneously responsive to the voltage at the first terminal, the first and second switching circuits respectively including output terminals that are DC connected to the control electrodes of the first and second transistors; and (b) first and second capacitors that are respectively DC connected between (i) the first control electrode and the first power supply terminal and (ii) the second control electrode and the second power supply terminal, the first switching circuit including a first resistive element for supplying current from a first power supply terminal of the power supply terminals to the control electrode of the first transistor and the first capacitor while the voltage at the first terminal has the first level, the first switching circuit being arranged for supplying a voltage substantially equal to the voltage at a second power supply terminal of the power supply terminals to (i) the control electrode of the first transistor and (ii) the first capacitor while the voltage at the first terminal has the second level; the second switching circuit including a second resistive element for supplying current from the second power supply terminal to the control electrode of the second transistor and the second capacitor while the voltage at the first terminal has the second level, the second switching circuit being arranged for supplying a voltage substantially equal to the voltage at the first power supply terminal to (i) the control electrode of the second transistor and (ii) the second capacitor while the voltage at the first terminal has the first level, the first switching circuit comprising: a first inverter including third and four transistors respectively switched on and off in response to the voltage at the first terminal respectively having first and second values, the first inverter including the first resistive element for supplying current from the first power supply terminal to the control electrode of the first transistor and the first capacitor while the third transistor is switched on; the second switching circuit comprises a second inverter including fifth and sixth transistors respectively switched on and off in response to the voltage at the first terminal respectively having first and second values, the second inverter including the second resistive element for supplying current from the second power supply terminal to the control electrode of the second transistor and the second capacitor while the sixth transistor is switched on, each of the inverters including a PFET and an NFET, the PFET and NFET of each inverter having a source drain path and a gate electrode having a connection to the first terminal so that the gate electrodes of the PFETs and NFETs of the inverters are driven in parallel by the voltage at the first terminal, the output terminal of each of the inverters being between the source drain paths of the PFET and NFET thereof, the first and second resistive elements respectively comprising first and second resistors, the first resistor being connected between the source drain path of the NFET of the first inverter and the output terminal of the first inverter, the second resistor being connected between the source drain path of the PFET of the second inverter and the output terminal of the second inverter.

11. The circuit of claim 10 wherein the fourth and fifth transistors while switched on are connected to supply voltages substantially at the second and first power supply terminals to the control electrodes of the first and second transistors and the first and second capacitors, respectively.

12. The circuit of claim 11 wherein all the transistors and capacitors are field effect devices.

13. The circuit of claim 12 wherein all the transistors and capacitors are included on an integrated circuit chip, the first and second resistive elements including first and second resistors on the chip.

* * * * *